(12) United States Patent
Heitzer (10) Patent No.: US 10,628,536 B2
(45) Date of Patent: Apr. 21, 2020

(54) METHOD FOR COMPUTING SELF-CONTAMINATION PROCESSES OF A SPACECRAFT

(71) Applicant: Airbus DS GmbH, Taufkirchen (DE)

(72) Inventor: Joerg Heitzer, Immenstaad (DE)

(73) Assignee: AIRBUS DS GMBH, Taufkirchen (DE)

( * ) Notice: Subject to any disclaimer, the term of this patent is extended or adjusted under 35 U.S.C. 154(b) by 845 days.

(21) Appl. No.: 14/567,204

(22) Filed: Dec. 11, 2014

(65) Prior Publication Data
US 2015/0169805 A1    Jun. 18, 2015

(30) Foreign Application Priority Data

Dec. 12, 2013    (EP) ..................... 13005781

(51) Int. Cl.
| | |
|---|---|
| *G06F 17/50* | (2006.01) |
| *G06F 17/10* | (2006.01) |
| *B64G 99/00* | (2009.01) |
| *B64G 1/52* | (2006.01) |
| *B64G 1/22* | (2006.01) |

(52) U.S. Cl.
CPC .......... *G06F 17/5009* (2013.01); *B64G 1/52* (2013.01); *B64G 9/00* (2013.01); *G06F 17/10* (2013.01); *B64G 1/226* (2013.01)

(58) Field of Classification Search
CPC . B64G 1/52; B64G 7/00; B64G 1/226; B64G 9/00; G06F 17/5009; G06F 17/10
See application file for complete search history.

(56) References Cited

PUBLICATIONS

Theroude, Christophe et al. "Overview of Contamination Modelling in EADS Astrium." 10th International Symposium on Materials in Space, Jun. 2006, Collioure, France [retrieved on Mar. 28, 2017]. Retrieved from <http://www.systema.airbusdefenceandspace.com/fileadmin/user_upload/6bqtxsryuaaaega7mbjrp6/Contamination%20Collioure%20Theroude.467.pdf>.*
Scialdone, John. "Self Contamination and Environment of an Orbiting Spacecraft." NASA TN D-6645, May 1972 [retrieved Mar. 24, 2017]. Retrieved from <https://ntrs.nasa.gov/archive/nasa/casi.ntrs.nasa.gov/19720016263.pdf>.*
Hall, David F et al. "Progress on Spacecraft Contamination Model Development." Proc. SPIE 4096, Optical Systems Contamination and Degradation II: Effects, Measurements, and Control, 138, Sep. 20, 2000. [retrieved on Mar. 28, 2017]. Retrieved from <http://proceedings.spiedigitallibrary.org/pdfaccess.ashx?resourceid=1610015&pdfsource=24>.*

(Continued)

*Primary Examiner* — Rehana Perveen
*Assistant Examiner* — Alfred H B Wechselberger
(74) *Attorney, Agent, or Firm* — Crowell & Moring LLP (57) ABSTRACT

A method for computing self-contamination processes of a spacecraft involves receiving a first set of input parameters comprising general definitions of the spacecraft, and a second set of input parameters comprising control parameters for the spacecraft orbital data, physics, numeric. A self-contamination process of the spacecraft is calculated based on the received first and second sets of input data by calculating an analytical solution of a basic equation for calculating a deposit of molecules outgassed from surfaces of the spacecraft in a single computation step with the data processing device. The calculated deposit of molecules is then output.

3 Claims, 6 Drawing Sheets

(56) References Cited

PUBLICATIONS

Harvey, RL. "Spacecraft Neutral Self-Contamination by Molecular Outgassing." Journal of Spacecraft and Rockets, vol. 13, No. 5, pp. 301-305, 1976 [retrieved on Mar. 24, 2017]. Retreived from <https://arc.aiaa.org/doi/abs/10.2514/3.27906>.*

Theroude, C. "Outgassing Software User's Manual." MOS.UM.93694.ASTR, Issue 03 Revision 00: Astrium, EDS, Sep. 2010 edition [retrieved on Apr. 4, 2017]. Retrieved from <https://web.archive.org/web/20170404144715/http://ablemax.ipdisk.co.kr:5212/publist/HDD1/software/5.SYSTEMA/1.Systema/1.Systema_V3/3.Doc/gassing%203.2.32%20User%20Manual.pdf>.*

Matrix Exponential. Wikipedia, Nov. 2013 [retrieved on Apr. 5, 2017]. Retreived from <https://en.wikipedia.org/w/index.php?title=Matrix_exponential&oldid=581663669>.*

Taylor series. Wikipedia, Dec. 11, 2013 [retrieved on Apr. 5, 2017]. Retreived from <https://en.wikipedia.org/w/index.php?title=Taylor_series&oldid=585609492>.*

Gustafson, G "Systems of Differential Equations." Chapter 11, p. 1 [retrieved on Sep. 17, 2018]. Retrieved from <http://www.math.utah.edu/~gustafso/2250systems-de.pdf> (Year: 2007).*

Fong et al. "Comparison of MTK and MOLFLUX models for molecular transport among multiple surface nodes". Proc. SPIE 3427, Optical Sys Contam and Degrad, doi: 10.1117/12.328497 [retrieved on Sep. 17, 2018]. Retrieved from <https://www.spiedigitallibrary.org/conference-proceedings-> (Year: 1998).*

Roussel et al. "Spacecraft Plasma Interaction Software (SPIS): Numerical Solvers—Methods and Architecture" JAXA Special Publication, JAXA-SP-05-001E [retrieved on Sep. 17, 2018]. Retrieved from <https://repository.exst.jaxa.jp/dspace/handle/a-is/27659> (Year: 2005).*

"Adverse". Merriam-webster, adj [retrieved on Jun. 3, 2019]. Retrieved from <https://www.merriam-webster.com/dictionary/adverse> (Year: 2019).*

Silver, D. "Modeling of spacecraft contam . . . " Proc. SPIE 1754, Opt. Sys. Contam. [retrieved Sep. 17, 2018]. Retrieved <https://www.spiedigitallibrary.org/conference-proceedings-of-spie/1754/0000/Modeling-of-spacecraft-contamination-outgassing-as-a-diffusion-controlled-process/10.1117/12.140750.full> (Year: 1992).*

Mauldin III, et al. "Optical degradation due to contam . . . " Proc. SPIE 0338, Spacecraft Contam. Env. [retrieved Jun. 12, 2019]. Retrieved <https://www.spiedigitallibrary.org/conference-proceedings-of-spie/0338/0000/Optical-Degradation-Due-To-Contamination-On-The-SAGE-SAGE-LI/10.1117/12.933638.full> (Year: 1983).*

Extended European Search Report dated Jun. 10, 2014 (seven (7) pages).

Onera et al., "COMOVA General Organisation—Input Parameters," Dec. 31, 2001, URL: http://www-mip.onera.fr/comova/html/comova/organisation/mn_orga.htm?nTrio=7, XP055120954 (one (1) page).

Onera et al., "COMOVA The Physics—Contaminant Transport," Dec. 31, 2001, URL: http://www-mip.onera.fr/comova/html/comova/param/mn_param.htm?nTrio=8, XP055120961 (one (1) page).

Bunte et al., "ESABASE2 GUI | ESABASE2—Graphical User Interface," Nov. 14, 2011, URL: http://web.archive.org/web/20111114025559/http://esabase2.net/screenshots/esabase2-qui/,XP055120959 (two (2) pages).

Rampini et al., "Dynamic Outgassing Testing: A Revisited Mathematical Approach," Aug. 16, 2009, URL: http://esmat.esa.int/amterials_news/isme09/pdf/6-Contamination/PosterContamination_-_Rampini.pdf, XP055120982, (six (6) pages).

Schläppi et al., "Influence of spacecraft outgassing on the exploration of tenuous atmospheres with in situ mass spectrometry," Journal of Geophysical Research: Space Physics, Dec. 14, 2010, vol. 115, Issue A12, URL: http://onlinelibrary.wiley.com/enhanced/doi/10.1029/2010JA015734, XP055120981 (twenty-four (24) pages).

Roussel et al., "A New Frontier for Contamination: Reaching the Molecules," Oct. 5, 2009, URL: http://esmat.esa.int/materials_news/isme09/pdf/1-Opening/Roussel.pdf , XP055120983 (eleven (11) pages).

Haessig et al. "Spacecraft outgassing, a largely underestimated phenomenon" $2^{nd}$ International Conference on Space Technology (ICST), Sep. 15-17, 2011, pp. 1-4 Print ISBN: 978-1-4577-1874-8.

Christophe Theroude, "Outgassing Software User's Manual", Sep. 2010, pp. 1-31, Astrium, France.

* cited by examiner

METHOD FOR COMPUTING SELF-CONTAMINATION PROCESSES OF A SPACECRAFT

CROSS-REFERENCE TO RELATED APPLICATIONS

This application claims priority under 35 U.S.C. § 119 to European application 13 005 781.3-1757, filed Dec. 12, 2013, the entire disclosure of which is herein expressly incorporated by reference.

TECHNICAL FIELD

The invention relates to a method for computing self-contamination processes of a spacecraft.

BACKGROUND

Self-contamination processes of a spacecraft such as a satellite may be caused by molecules, which outgas from surfaces of the spacecraft in vacuum, particularly from coatings, and are desorbed from the surfaces. Self-contamination may cause adverse changes of the characteristics of the surfaces, for example may degrade the spectral and directional characteristics of optical surfaces or the emissivity, absorptivity, and reflectivity of non-optical surfaces. The publication "Spacecraft outgassing, a largely underestimated phenomen", M-Hässig et al., $2^{nd}$ International Conference on Space Technology (ICST), 15-17 Sep. 2011, pages 1-4 Print ISBN: 978-1-4577-1874-8, discusses the problems caused by outgassing and contamination phenomena measured during the Rosetta spacecraft mission.

Since such adverse changes may be critical for space missions, analytical models based on numerical methods have been developed for computing self-contamination processes and determining adverse changes before the launch of a critical space mission. Due to the different materials used in modern spacecraft, self-contamination processes occur in highly different time scales. However, the numerical methods used in the known analytical models for computing self-contamination processes require very long computing times particularly at short time scales and usually produce numerical errors.

The European Space Agency (ESA) provides software called COMOVA (Contamination Modelling Outgassing & Vent Analyses tool) for spacecraft molecular external contamination modelling (Internet: mip.onera.fr/comova/). COMOVA allows the computation of contamination of spacecraft surfaces, but requires relatively long computing times. COMOVA may be also used within ESABASE2 Space Engineering Analysis Tool (Internet: esabase2.net/product/esabase2-comova/) in order to provide computation of contamination deposits on surfaces, including the calculation of view factors and surface temperature effects.

SUMMARY OF THE INVENTION

Exemplary embodiments of the present invention are directed to a method for computing self-contamination processes of a spacecraft, which can compute results within a time period, which is significantly shorter than the computing time required by computing methods based on known numerical solution schemes, and which produces much more accurate results.

The present invention proposes a novel algorithm for computing self-contamination processes of a spacecraft based on an analytical solution of the mathematical equations underlying the problem of outgassing and self-contamination of different materials of a spacecraft.

An embodiment of the invention relates to a method for computing self-contamination processes of a spacecraft by means of a data processing device comprising the following steps: receiving a first set of input parameters comprising general definitions of the spacecraft, receiving a second set of input parameters comprising control parameters for the spacecraft orbital data, physics, numeric, computing a self-contamination process of the spacecraft based on the received first and second sets of input data by calculating an analytical solution of a basic equation for calculating a deposit of molecules outgassed from surfaces of the spacecraft in a single computation step with the data processing device, and outputting the calculated deposit. Depending on the surfaces properties such as piecewise constant or time dependent emission and reemission coefficients, a suitable basic equation for calculating a deposit of molecules outgassed from surfaces of the spacecraft may be selected, which may then be analytically solved in a single computation step, which means that no iterative, time consuming and unneeded intermediate steps are required for computing the solution of the basic equation.

The step of computing a self-contamination process may comprise the step of computing view factors $F_{ji}$ of a mesh element j of a surface of the spacecraft with respect to a mesh element i of a surface of the spacecraft, wherein the spacecraft is represented as a collection of surfaces, which are subdivided into mesh elements (in the sequel called "nodes") with outgassing properties that can vary from mesh element to mesh element or node to node, respectively.

The calculating of an analytical solution of the basic equation may comprise calculating the deposit for piecewise constant emission and reemission constants of the surfaces of the spacecraft, with the abbreviated basic equation being $$\dot{y}=Ay+b$$

with y being the deposit at time t, A being a constant matrix calculated from the view factors $F_{ji}$ and the reemission coefficients and b being a vector consisting of the emission coefficients, view factors and the initial deposit. In this case, the calculating of the deposit may comprise computing the integral equation for calculating the deposit at time $t_n$ of the n-th time interval of the deposit according to the following equation:

$$y(t_n) = \int_{t_{n-1}}^{t_n} e^{A_n(t_n-s)}b(s)ds + e^{A_n(t_n-t_{n-1})}y_{n-1},$$

wherein $y_{n-1}$ is the cumulative deposit that had been calculated during the previous n−1 time steps, $A_n$ is a piecewise constant matrix calculated from the view factors $F_{ji}$ and the reemission coefficients, and b(s) is a vector consisting of the emission coefficients, view factors and the initial deposit at time s.

The calculating of an analytical solution of the basic equation may also comprise calculating the deposit for time dependent emission and reemission coefficients of the surfaces of the spacecraft with a linearized basic equation of the form $$\dot{y}=Ay+tBy+b(t)$$

with y being the deposit at time t, A and B being constant matrices calculated from the time-dependent reemission coefficients and the view factors $F_{ji}$ and b being a vector consisting of the time-dependent emission coefficients, view factors and the initial deposit. In this case, the calculating of the deposit may comprise computing the integral equation for calculating the deposit at time t, which is running in an interval $0 \leq t \leq t_A$ in which matrices A, B are constant:

$$y(t) = e^{At}c + \int_0^t e^{A(t-s)} sBy(s)ds + \int_0^t e^{A(t-s)} b(s)ds,$$

wherein the integration constant c is determined by inserting the boundary condition $y(0)=y_0$ as deposit at time $t=0$ to be $c=y_0$, and b(s) is a vector consisting of the time-dependent emission coefficients, view factors and the initial deposit at time s.

A further embodiment of the invention relates to a computer program, which implements the method for computing self-contamination processes of a spacecraft according to the invention and as described herein and enables the computing of self-contamination processes of a spacecraft according to the invention when executed by a computer. Such a computer program could be integrated in a software suite for computing and simulating spacecraft.

According to a further embodiment of the invention, a record carrier storing a computer program according to the invention may be provided, for example a CD-ROM, a DVD, a memory card, a diskette, or a similar data carrier suitable to store the computer program for electronic access.

These and other aspects of the invention will be apparent from and elucidated with reference to the embodiments described hereinafter.

The invention will be described in more detail hereinafter with reference to exemplary embodiments. However, the invention is not limited to these exemplary embodiments.

DETAILED DESCRIPTION

In the following, functionally similar or identical elements may have the same reference numerals. Absolute values are shown below by way of example only and should not be construed as limiting the invention.

0. Basics of the Computation of Self-Contamination Processes of a Spacecraft

For computing self-contamination processes of a spacecraft, which particularly comprises different materials, the spacecraft is represented as a collection of surfaces, which are sub-divided into nodes (mesh elements) that have varying outgassing properties and emit and exchange contaminant mass. The contaminant molecules emitted by the surfaces and the bulk of the spacecraft move towards all spacecraft surfaces.

For computing a self-contamination process of a spacecraft with a data processing device such as a computer, which executes a computer program implementing basic steps of the inventive method, the data processing device receives two sets of input parameters: a first set of input parameters contains general definitions of the spacecraft such as parameters of the geometry of the spacecraft, properties of surfaces of the spacecraft, particularly outgassing/emission and reemission properties of the surfaces or coatings of the surfaces, and temperatures. A second set of input parameters contains control parameters for the spacecraft orbital data, physics, numeric. The spacecraft orbital data typically comprise orbit definition and interpolation data and kinematics data. The control parameters for physics comprise data for atmosphere definition and transport definition. The control parameters for numeric may comprise parameters for raytracing and view factors, parameters regarding surfaces sensitive to contamination and to outgassing, and/or volume mesh data.

The data processing device processes the received input data for computing a self-contamination process of the spacecraft. The computation comprises calculating an analytical solution of a basic equation for calculating a deposit of molecules outgassed from surfaces of the spacecraft. The computation may be divided in two basic steps:

Computation of view factors, i.e. the proportion of the total mass emitted by a node i and reaching node j.

Solution of the integral equation of the deposit as the analytical solution of a basic equation.

The view factors $F_{ij}$ between two surfaces mesh elements (nodes) i and j are calculated in a first step. The view factors can be defined at macroscopic level as the mass or the molecules emitted by node or surface mesh element i, which reach(es) node or surface mesh element j, divided by the entire mass or all molecules emitted by node or surface mesh element i. At a microscopic level, view factors $F_{ij}$ can be defined as the probability for a molecule emitted by node i reaching node j.

Figure 1:
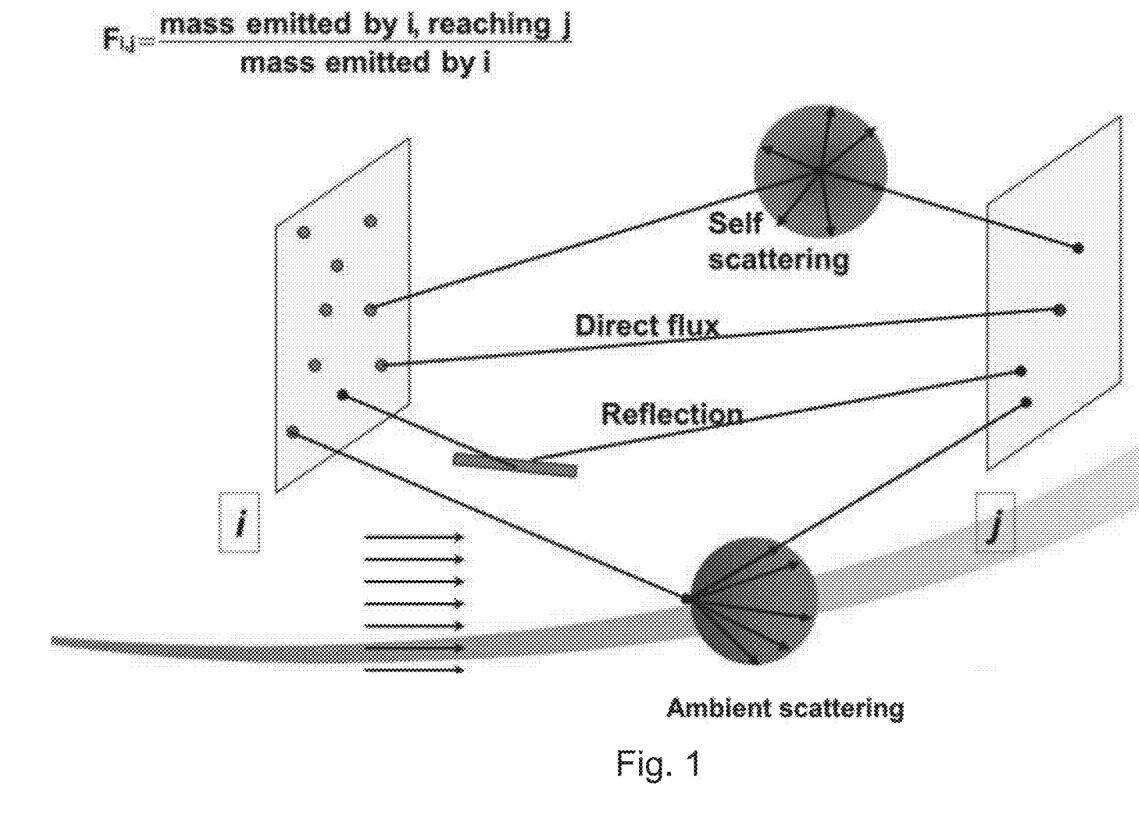
FIG. 1 shows schematically the process of self-contamination by means of two surfaces i and j.

As shown in FIG. 1, the transfer of mass between two nodes i and j comprises direct flux, flux scattered by other contaminant molecules (self-scattering), flux scattered by ambient gas flux (ambient gas scattering), and flux reemitted from spacecraft surfaces.

The view factors $F_{ij}$ can be determined by a Monte-Carlo ray-tracing as briefly explained in the following: a node i randomly emits a large number of rays, which represent the outgassed molecules. The emission of rays can be performed as follows: emission points are sampled according to an iso-distribution law; emission directions are sampled according to Lambert's law. The mean free path $\lambda_a$ is based on Robertson formula where the cross-section is computed by the Hard Sphere model. For each ray, a collision distance $d_c$ is sampled at random according to the collision probability law $P(x)=e^{-x/\lambda_a}$, where x is the distance and $\lambda_a$ is the mean free path. By comparing the distance, the molecule is either scattered or impinges the node j. If $d_c<d_j$, a collision is accepted, otherwise it is rejected. If a collision is rejected, the molecule reaches node j and contributes to $F_{ij}$. If a collision is accepted, the molecule is reemitted from the collision point with a random direction and reaches the node k and contributes to $F_{ik}$.

After calculating the view factors $F_{ij}$, the mass deposit can be calculated as briefly outlined in the following: the nodes i, j, k, . . . form a network where each pair of elements i, j or i, k or j, k is related by their view factors $F_{ij}$, $F_{ik}$ or $F_{jk}$. Each element has emission, deposition and reemission of deposited contaminants. Thus, this problem becomes a system of differential equations of first order, which can be solved by the inventive solution as explained in the following in detail.

The computation steps according to the inventive solution and as described in the following can be implemented in a computer program such as an additional module or plug-in for the above mentioned COMOVA-software and can significantly reduce the computation time required for computing self-contamination processes of spacecraft consisting of different materials with different outgassing and desorbing behavior. An annex at the end of the description of embodiments serves to explain some backgrounds of the computation steps and the solving of several equations.

1. Calculation of Deposits for Piecewise Constant Emission and Reemission Constants 1.1 The Basic Equation for Deposit The equation (as defined in the OUTGASSING Software User's Manual, internal document identification MOS.UM.93694.ASTR, on page 136, equation (72), incorporated herein by reference; simplified form of the equation can be found in Van Eesbeek M., Zwaal A., "Outgassing and Contamination Model Based on Residence Time", Proceedings of the Third European Symposium on Spacecraft Materials in Space Environment, Noordwijk, October 1985, (ESA SP-232)) for the deposit on a node "i" that is to be solved is as follows:

$$\dot{W}_{d,i} = \left(\frac{F_{ji} - \delta_{ij}}{\tau_{r,j}}\right) W_{d,j} + \frac{F_{ji}}{\tau_{e,j}} W_{e,j}^0 \exp\left(\frac{-t}{\tau_{e,j}}\right) = A_{ij} W_{d,j} + Q_i \quad (1)$$

wherein $F_{ji}$ denotes a view factor from node j (first surface mesh element) to node i (second surface mesh element), $\tau_{r,j}$ denotes a reemission constant of node j, $\tau_{e,j}$ denotes a emission constant of node j. Here coefficient matrix $A_{ij}$ is constant.

1.2 General Form of the Analytical Solution for a Piecewise Constant Coefficient Matrix For the sake of readability, equation (1) is abbreviated to $$\dot{y} = Ay + b \quad (2)$$

as the equation to be solved. Then $$e^{-At}\dot{y} - Ae^{-At}y = e^{-At}b \text{ because } [e^{-At}A] = 0 \quad (3)$$

It is assumed that t is running in an interval $t_A \leq t \leq t_B$ in which matrix A is constant. Then it holds that $$\frac{d}{dt}(e^{-At}y) = e^{-At}b.$$

Performing the integration up to time t gives $$y(t) = \int_{t_A}^{t} e^{A(t-s)}b(s)ds + e^{At}c \quad (4)$$

The integration constant c is determined by inserting the boundary condition $y(t_A) = y_A$ as deposit at time $t_A$ to be $$c = e^{-At_A}y_A \quad (5)$$

So that the complete solution takes on the form:

$$y(t) = \int_{t_A}^{t} e^{A(t-s)}b(s)ds + e^{A(t-t_A)}y_A \quad (6)$$

If matrix A is piecewise constant in successive time intervals the above analysis can be carried out successively in each interval:

Let $0 \leq t_1 \leq t_2$ and $A(t) \equiv A_1 = \text{const for } 0 \leq t \leq t_1$ and $A(t) \equiv A_2 = \text{const for } t_1 < t \leq t_2$.

For $t_1 < t \leq t_2$ the deposit is calculated now as $$y(t) = \int_{t_1}^{t} e^{A_2(t-s)}b(s)ds + e^{A_2(t-t_1)}y_1 \quad (7)$$

where $$y_1 = \int_{0}^{t_1} e^{A_1(t_1-s)}b(s)ds + e^{-A_1 t_1}y_0$$

and $y_0$ as deposit at time t=0 which is usually 0.

Generalizing this to n intervals yields the deposit at time $t_n$ of the n-th interval:

$$y(t_n) = \int_{t_{n-1}}^{t_n} e^{A_n(t_n-s)}b(s)ds + e^{A_n(t_n-t_{n-1})}y_{n-1} \quad (8)$$

Here $y_{n-1}$ is the cumulative deposit that had been calculated during the previous n−1 time steps.

1.3 The Explicit Form of the Analytical Solution for a Piecewise Constant Coefficient Matrix In order to carry out the integration of eq. (8) the eigenvalue decomposition of eq. (2) must be used:

$$(e^{At})_{ij} = P_{im}\delta_{mn}\exp(\lambda_m t)P_{nj}^{-1} \quad (9)$$

where P is the matrix made up of the eigenvectors of A and $\lambda_m$ are its eigenvalues. If b(s) is taken to be the source term of eq. (1) the integration can be carried out:

$$W_{d,i}(t) = P_{ij}\int_{0}^{t}\delta_{jl}\exp(\lambda_l(t-s))P_{lm}^{-1}\frac{F_{mn}^T}{\tau_{e,n}}W_{e,n}^0\exp\left(\frac{-s}{\tau_{e,n}}\right)ds + \quad (10)$$

$$P_{ij}\delta_{jl}\exp(\lambda_l t)P_{lm}^{-1}W_{d,m}^0 =$$

$$P_{ij}\delta_{jl}\frac{1}{\lambda_l \tau_{e,n}+1}\left\{\exp(\lambda_l t) - \exp\left(\frac{-t}{\tau_{e,n}}\right)\right\}P_{lm}^{-1}F_{mn}^T W_{e,n}^0 +$$

$$P_{ij}\delta_{jl}\exp(\lambda_l t)P_{lm}^{-1}W_{d,m}^0 =$$

$$P_{ij}\left(P_{jm}^{-1}(F^T)_{ml}\frac{1}{\lambda_j \tau_{e,l}+1}\left\{\exp(\lambda_j t) - \exp\left(\frac{-t}{\tau_{e,l}}\right)\right\}W_{e,l}^0\right) +$$

$$P_{ij}\exp(\lambda_j t)P_{jm}^{-1}W_{d,m}^0$$

Eq. (10) describes the time dependency of the deposit in the first time interval between t=0 und t. Here $W_{d,m}^0$ denotes the deposit on node m at time t=0 which is usually zero. In any other time interval $t_{n-1} \leq t \leq t_n$ the equation has the same form as eq. (10):

$$W_{d,i}^n(t) = P_{ij}\left(P_{jm}^{-1}(F^T)_{ml} \frac{1}{\lambda_j^{(n)} \tau_{e,l}^{(n)} + 1} \left\{\exp(\lambda_j^{(n)} t) - \exp\left(\frac{-t}{\tau_{e,l}^{(n)}}\right)\right\} W_{e,l}^{n-1}\right) + \quad (11)$$
$$P_{ij}\exp(\lambda_j^{(n)} t) P_{jm}^{-1} W_{d,m}^{n-1}$$

so that the interval $t_{n-1} \leq t \leq t_n$ can be mapped on the interval $0 \leq t \leq (t_n - t_{n-1})$ where $W_{d,m}^n$ is the cumulative deposit up to time $t_{n-1}$ and $W_{e,l}^{n-1}$ is the adjusted emission strength:

$$W_{e,l}^{n-1} = W_{e,l}^0 \exp\left(\frac{-t}{\tau_{e,j}^{(1)}}\right) \exp\left(\frac{-(t_2 - t_1)}{\tau_{e,j}^{(2)}}\right) * \ldots * \exp\left(\frac{-(t_{n-2} - t_{n-1})}{\tau_{e,j}^{(n-2)}}\right) \quad (12)$$

and $\lambda_j^{(n)}, \tau_{e,l}^{(n)}$ are calculated using the temperatures that belong to the interval $t_{n-1} \leq t \leq t_n$.

1.4 Analysis of the Singularity

Eq. (10) seems to contain a singularity as the expression $\lambda_j \tau_{e,l} + 1$ may become 0 for a certain combination of parameters. It shall show now that this singularity is removable: Clearly $$\frac{1}{\lambda_j \tau_{e,l} + 1} \left\{\exp(\lambda_j t) - \exp\left(\frac{-t}{\tau_{e,l}}\right)\right\} = \quad (13)$$
$$\frac{1}{\tau_{e,l}} \frac{1}{\lambda_j + \frac{1}{\tau_{e,l}}} \exp(\lambda_j t)\left\{1 - \exp\left(-t\left(\lambda_j + \frac{1}{\tau_{e,l}}\right)\right)\right\}$$

If now $$\lambda_j + \frac{1}{\tau_{e,l}} \ll t$$

for any t (which should not exceed a value of $10^8$ sec$\approx$6 yr) the expression can be expanded as $$\frac{1}{\tau_{e,l}} \frac{1}{\lambda_j + \frac{1}{\tau_{e,l}}} \exp(\lambda_j t)\left\{1 - \exp\left(-t\left(\lambda_j + \frac{1}{\tau_{e,l}}\right)\right)\right\} \approx \frac{t}{\tau_{e,l}} \exp(\lambda_j t) \quad (14)$$

which is finite.

1.5 Test Cases

1.5.1 Two Plates with Constant Emission-and Reemission Constants

Eq. (1) was solved for two plates with perfect visibility. It was tested whether the computer program MATLAB® from MathWorks Inc. was able to solve the equation using the analytical solution for a time range that extended over 20 orders of magnitude. Results should be calculated at equally spaced points on a log 10 scale of the time axis so that a prospective user could check at one glance if peaks occurred even at very low times and what the end-of-life value would be.

Figure 2:
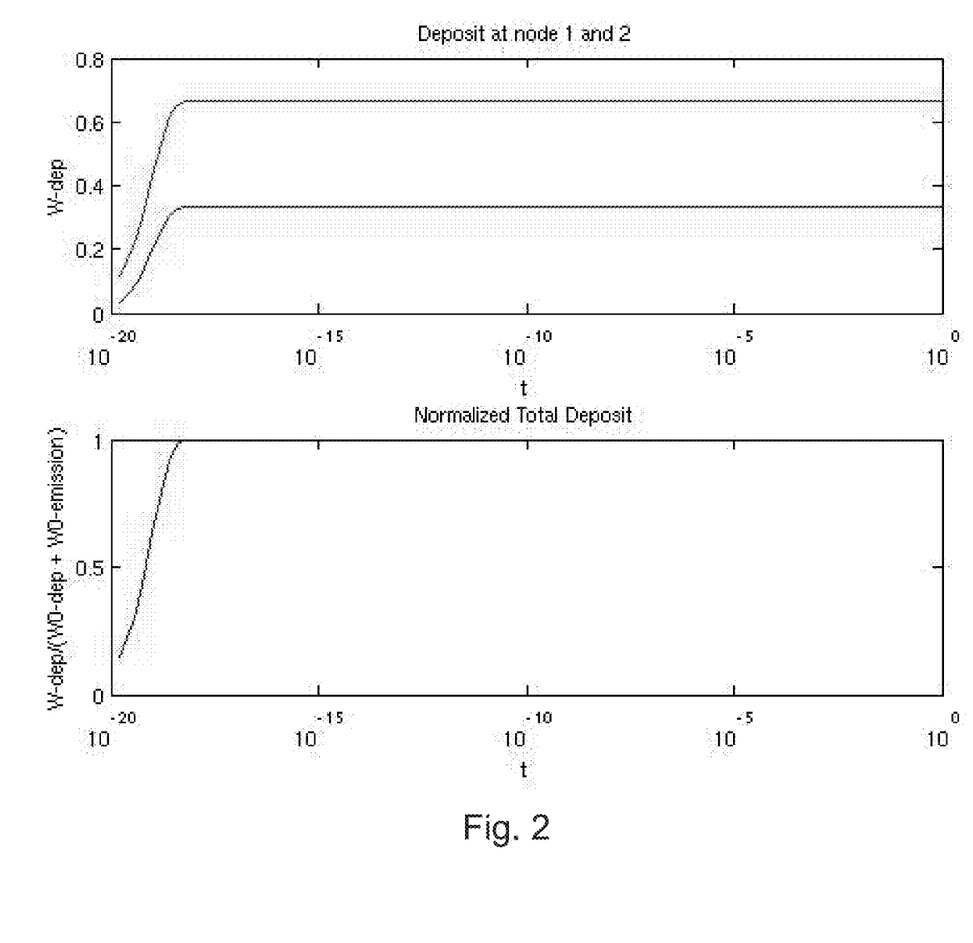
FIG. 2 shows two graphs with a deposit at a node 1 and a node 2 and a normalized total deposit as computed with the method according to the invention for a test case with two plates with constant emission and reemission constants.

The parameters used were:

$\tau_{r,i} = (1*10^{-20}, 2*10^{-20})$ $\tau_{e,i} = 10*\tau_{r,i}$ $W_{e,i}^0 = (1,0)$ N=100 time steps FIG. 2 shows a smooth and sufficiently detailed resolution at the low end of the timescale. As no mass is lost due to the geometry, the total mass is conserved.

The results are identical to results derived with the complete analytical formulation up to 16 digits.

2. Calculation of Deposits for Piecewise Linear Emission and Reemission Constants

2.1 The Emission Law for a Time-Dependent Emission Constant

In case the emission constant does not depend on time, the emission of material from the bulk is described by $$W_e(t) = W_e^0 \exp\left(\frac{-t}{\tau_e}\right)$$

with $W_e^0$ being the total emittable material. (15)
This equation is the solution of the first order reaction kinetic equation $$\dot{W}_e(t) = \frac{-W_e(t)}{\tau_e} \quad (16)$$

with $\tau_e$ being the time-independent emission constant which is determined by the Arrhenius law:

$$\tau_e = \tau_e^0 \exp\left(\frac{E_{act}}{RT}\right) \quad (17)$$

In the sequel it shall be assumed that $t_A \leq t \leq t_B$ and that temperature T varies linearly in this interval. The emission laws provided by ESTEC (European Space Research and Technology Centre) and CNES (Centre national d'études spatiales) as well as the Arrhenius law are exponentials in T. Nevertheless it shall be approximated eq. (17) by a finite difference in the interval $t_A \leq t \leq t_B$:

$$\tau_e(t) \approx \tau_e(t_A) + (t - t_A) \frac{\tau_e(t_B) - \tau_e(t_A)}{t_B - t_A} \equiv \tau_e + (t - t_A)\dot{\tau}_e \quad (18)$$

This approximation can be applied to the ESTEC and CNES model alike as the finite difference quotient is computed simply by setting the temperatures that prevail at time $t_A$ and $t_B$ into the emission law that one wishes to use.

Eq. (18) can be set into eq. (16) and the integration carried out to yield $$W_e(t) = W_e^0 \left(\frac{\tau_e - t_A \dot{\tau}_e}{\tau_e + (t - t_A)\dot{\tau}_e}\right)^{\frac{1}{\dot{\tau}_e}} \quad (19)$$

Expanding into first order of the slope $\dot{\tau}_e$ gives the expression:

$$W_e(t) = W_e^0 \exp\left(\frac{-t}{\tau_e}\right)\left(1 + \frac{t(t-2t_A)}{2\tau_e^2}\dot{\tau}_e + \ldots\right) \quad (20)$$

which reduces to the old emission law in case of vanishing slope.

2.2 The Basic Equation for Deposit

In addition to the emission constants the reemission constants must also be considered to be time-dependent. This leads to a time dependency of the matrix $A_{ij}$ of eq. (1) which will be linearized according to eq. (18) with t in $t_A \leq t \leq t_B$.

$$\left(\frac{F_{ji} - \delta_{ij}}{\tau_{r,j}(t)}\right) = \quad (21)$$

$$\left(\frac{F_{ji} - \delta_{ij}}{\tau_{r,j}(t_A)}\right) + \left(\frac{t-t_A}{t_B-t_A}\right)\left\{\left(\frac{F_{ji} - \delta_{ij}}{\tau_{r,j}(t_B)}\right) - \left(\frac{F_{ji} - \delta_{ij}}{\tau_{r,j}(t_A)}\right)\right\} \equiv A_{ij} + (t-t_A)B_{ij}$$

Again the formulation is independent of the model used (CNES or ESTEC) as only the reemission constants that belong to the temperatures at times $t_A$, $t_B$ enter the equation. With the results of the previous chapter the equation for the deposit can be formulated as follows:

$$\dot{W}_{d,i} = (A_{ij}W_{d,j} + (t-t_A)B_{ij})W_{d,j} + \quad (22)$$

$$\frac{F_{ji}}{\tau_{e,j} + (t-t_A)\dot{\tau}_{e,j}} W_{e,j}^0 \left(\frac{\dot{\tau}_{e,j} - t_A \dot{\tau}_{e,j}}{\tau_{e,j} + (t-t_A)\dot{\tau}_{e,j}}\right)^{\frac{1}{\dot{\tau}_{e,j}}}$$

2.3 General Form of the Approximate Solution

Eq. (22) is an inhomogeneous ODE (Ordinary Differential Equation)-system with time dependent coefficients. In order to apply the method of variation of coefficients like in the chapter "Calculation of deposits for Piecewise constant emission-and reemission constants" a full set of solution vectors called fundamental system of the homogeneous system is needed. Usually it is not possible to calculate the fundamental system analytically. Instead the ODE-system shall be cast into the form of an integral equation which then will be solved approximately using the trapezium rule.

Using the notation of eq. (2) the eq. (22) now has the form $$\dot{y} = Ay + tBy + b(t) \quad (23)$$

Now it holds that $$\frac{d}{dt}(e^{-At}y) = te^{-At}By + e^{-At}b(t) \quad (24)$$

It is assumed that t is running in an interval $0 \leq t \leq t_A$ in which matrices A, B are constant.
It follows that $$y(t) = e^{At}c + \int_0^t e^{A(t-s)}sBy(s)ds + \int_0^t e^{A(t-s)}b(s)ds \quad (25)$$

The integration constant c is determined by inserting the boundary condition $y(0)=y_0$ as deposit at time $t=0$ to be $$c = y_0 \quad (26)$$

2.4 Explicit Form of the Approximate Solution
Eq. (28) is rewritten as $$y(t) = y^c(t) + \int_0^t e^{A(t-s)}sBy(s)ds \quad (27)$$

and the diagonalisation of matrix A is used. In index notation:

$$y_i(t) = y_i^c(t) + P_{il}\int_0^t P_{lm}^{-1}B_{mn}se^{\lambda_l(t-s)}y_n(s)ds \quad (28)$$

It shall now be approximated using the trapezium rule $$\int_0^t P_{lm}^{-1}B_{mn}se^{\lambda_l(t-s)}y_n(s)ds \approx P_{lm}^{-1}B_{mn}\frac{t}{2}(0 + e^{\lambda_l 0})y_n(t) \quad (29)$$

Now $$y_i - B_{in}y_n\frac{t}{2} = y_i^c(t) \quad (30)$$

Solving for y yields $$y_m = \left(\delta_{mi} - B_{mi}\frac{t}{2}\right)^{-1} y_i^c(t) \quad (31)$$

This inverse matrix is usually not computed explicitly. Instead the system of equations of eq. (30) is solved by Gaussian elimination which is much faster and more accurate.

The calculation of $y_i^c(t)$ shall now be presented:
As the emission law does not contain an exp-function any more, the integration cannot be carried out analytically. Instead one has:

$$y_i^c(t) = (e^{At}y_0)_i + \quad (32)$$

$$P_{ij}\left\{P_{jm}^{-1}F_{mn}^T W_{e,n}^0 (\tau_{e,n})^{1/\dot{\tau}_{e,n}} e^{\lambda_j t} \int_0^t e^{-\lambda_j s}(\tau_{e,n} + s\dot{\tau}_{e,n})^{(-1+1/\dot{\tau}_{e,n})} ds\right\}$$

The integration has to be carried out for every index pair (j, n). The result has first to be multiplied by $(\tau_{e,n})^{1/\tau_{e,n}}e^{\lambda_j t}$ and then multiplied with the corresponding entry of the matrix $P_{jm}^{-1}F_{mn}^T$. Evaluation of the integral amounts to calculating an incomplete hypergeometric function and can be time consuming.

2.5 Test Cases
2.5.1 Two Plates with Time Dependent Emission-and Reemission Constants
Eq. (31) and (32) were solved for the following set of parameters:

$$W_e^0 = (1,0)$$

$$\tau_r = 10^{-4}(1,1)$$

$$\tau_e = \dot{\tau}_e = 10\tau_r$$

$$B_{mi} = 100 A_{mi}$$

The following table displays the results for various values of t. Deposits calculated from eqs. (31, 32) had been checked with MATLAB®'s ODE45 and ODE15s solvers.

| t/sec | New solver | ODE45 | ODE15s | Max rel. error/% |
|---|---|---|---|---|
| 1e-4 | (2.753072, 6.762733)e-2 | (2.743272, 6.772533)e-2 | (2.742827, 6.772767)e-2 | 0.35 |
| 5e-4 | (1.839330, 2.094604)e-1 | (1.814627, 2.119308)e-1 | (1.814760, 2.119443)e-1 | 1.3 |
| 1e-3 | (3.111302, 3.208064)e-1 | (3.071725, 3.247641)e-1 | (3.073184, 3.249085)e-1 | 1.3 |
| 5e-3 | (4.965819, 4.965956)e-1 | (4.963851, 4.967924)e-1 | (4.959398, 4.961918)e-1 | 0.04 |

3. Treating a Nearly Defective Matrix
3.1 Computing the Pseudoinverse

As matrix A is generally nonsymmetrical and very large, its diagonalisation may become difficult. A large matrix whose entries vary over some orders of magnitude may have eigenvectors that are very similar.

Although it is highly unlikely that in practical cases a matrix ever becomes strictly defective in the mathematical sense (see Annex) it may be difficult to decide if eigenvectors are too close to be considered different. If this is the case, matrix P is not invertible because its condition number becomes large and the result will be unreliable because round off errors will be magnified arbitrarily. MATLAB® provides the function rank to compute the number of linearly independent rows or columns of a matrix.

Rank is defined as the number of all singular values of P which are larger than tol with $$\text{tol}=N^*\text{eps}(\max(s_{ii})) \quad (33)$$

With N being the dimension of P and $s_{ii}$ the diagonal matrix consisting of P's singular values.

Now if rank(P)<N, a complex matrix P cannot be inverted but the inverse can be approximated by the pseudo inverse P+.

Given the SVD of P as $$P=USV^* \quad (34)$$

the pseudo inverse $P^+$ can be constructed $$P^+=VS_{truncated}^{-1}U^* \quad (35)$$

with $S_{truncated}^{-1}$ as the truncated inverse of S which is simply constructed by setting to 0 every singular value which is smaller than the tolerance and inverting all the rest.

3.2 The Effect of the Number of Singular Values on the Deposit

In order to quantify the error that is made if the pseudo inverse according to eq. (35) is used instead of the true inverse of P, an analysis was carried out using a non-defective problem matrix $A_{ii}$ of rank N=2161 taken from an ongoing analysis. As the matrix was diagonalizable, a reference value against which the results derived with different pseudo inverses could be tested was available. The deposits were calculated on all nodes in 21 different runs, each time using 100 singular values more than before in building the pseudo inverse. In the $22^{nd}$ run, which was used as reference, all singular values were used. This reference run was compared to the result derived using the correct inv(P) and produced a relative error smaller than 1e-10.

Figure 3:
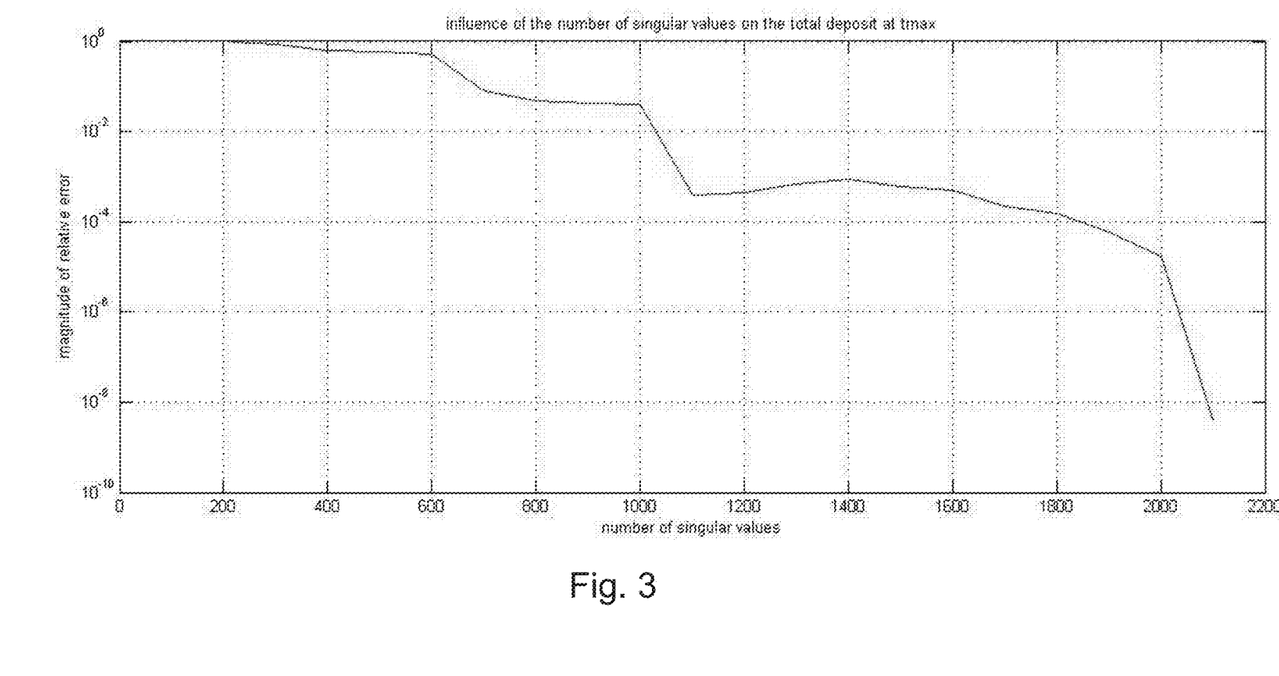
FIG. 3 shows a graph of an error of total deposit as a function of the number of singular values.

The following graph shows the magnitude of the relative error of the sum over all deposits at the end of the simulation time as a function of the number of singular values that were used in the construction of the pseudo inverse.

FIG. 3 shows a graph of the error of total deposit as a function of the number of singular values So using 2100 singular values out of 2161 produces a relative error lower than 1e-9.

Figure 4:
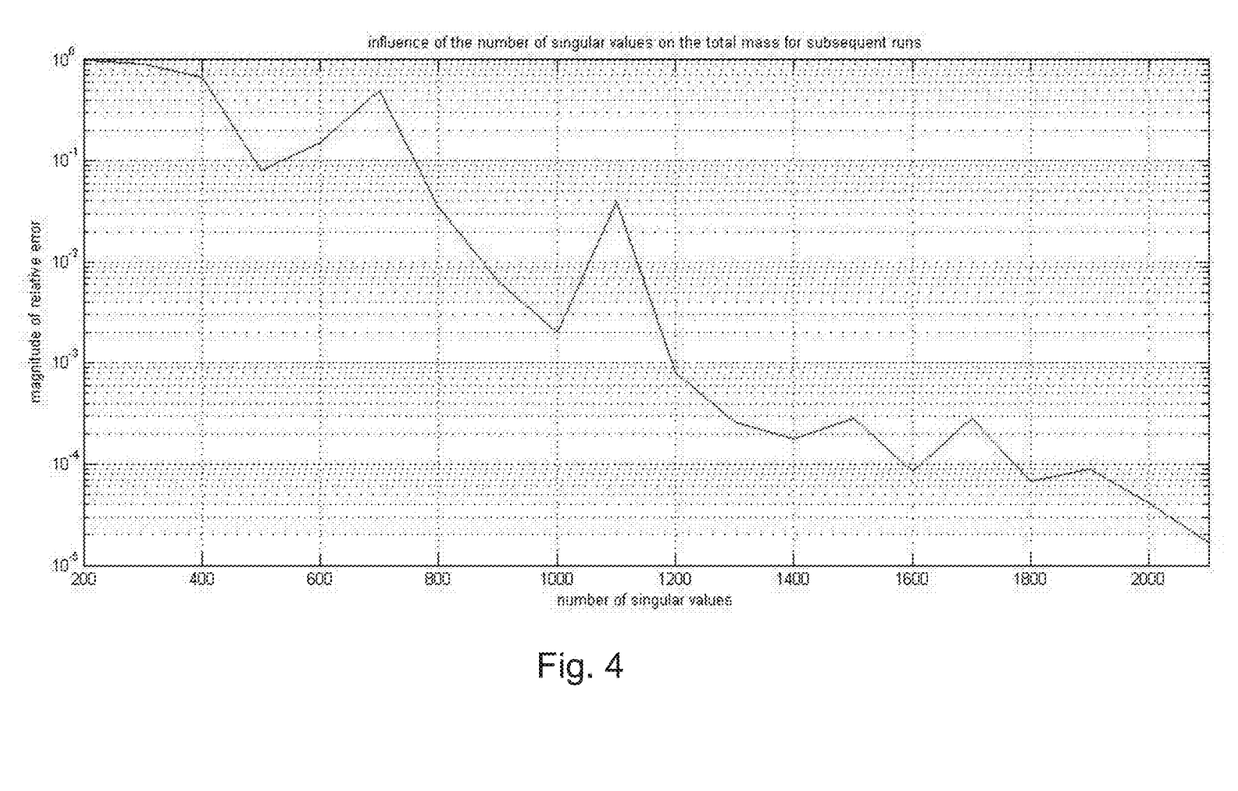
FIG. 4 shows a graph of an error of total deposit as a function of the number of singular values for subsequent runs.

In case the problem matrix is actually defective a convergence analysis has to be carried out in which results derived using more singular values are compared to results coming from less singular values. A suitable pseudo inverse can be found if the relative error calculated between subsequent runs becomes lower than a defined threshold. The following graph shows how the relative error of the total deposit develops when it is calculated between subsequent runs that use pseudo inverses which differ by 100 singular values. So the rightmost value (x-axis=2100) indicates a relative error of lower than 2e-5 when the total deposit calculated with 2100 singular values is compared to the one calculated using 2000 values.

FIG. 4 shows a graph of an error of total deposit as a function of the number of singular values for subsequent runs 4. Annex
4.1 Diagonalisation of a Matrix According to Yousef Saad, "Numerical methods for large eigenvalue problems", Cambridge University Press, 2 nd ed.:

1. An eigenvalue λ of A is said to have algebraic multiplicity μ if it is a root of multiplicity μ of the characteristic polynomial.
2. If an eigenvalue is of algebraic multiplicity one it is said to be simple. A nonsimple eigenvalue is said to be multiple.
3. An eigenvalue λ of A has geometric multiplicity γ if the maximum number of independent eigenvectors associated with it is γ
4. A matrix is said to be derogatory if the geometric multiplicity of at least one of its eigenvalues is larger than one.
5. An eigenvalue is said to be semi-simple if its algebraic multiplicity is equal to its geometric multiplicity. An eigenvalue that is not semi-simple is called defective.

The following two statements are equivalent:

A matrix of dimension n is diagonalizable if and only if it has n linearly independent eigenvectors.

A matrix is diagonalizable if and only if all its eigenvalues are semi-simple.

Three cases thus can be distinguished:
1. All eigenvalues are distinct: In this case the matrix is diagonalizable.
2. All eigenvalues are semi-simple which means that algebraic multiplicity μ>1 but each multiple eigenvalue has μ linearly independent eigenvectors: In this case the matrix is diagonalizable.
3. At least one eigenvalue is not semi simple: In this case the matrix is not diagonalizable and is called defective.

4.2 Definition of the Relative Machine Precision

According to IEEE standards the relative machine precision is defined as follows: To a given double precision number x the next distinct double precision number x+ε must obey $$\frac{|\varepsilon|}{|x|} \leq 2^{-52}$$

MATLAB® defines ε(X) for any double precision number X as the next larger in magnitude floating point number with the same precision as X.

4.3 Strategies to Improve the Accuracy of the Inverse

The structure of the solution requires the knowledge of matrix $P_{lm}^{-1}$. Using the inbuild inversion routines of MATLAB® might produce residuals which are considered too large, in particular as the problem matrix A is not symmetric and thus numerical strategies for inversion might not converge fast or accurate enough.

Using Left Eigenvectors

We can exploit the fact that a left eigenvector of the problem matrix A is the transpose of a right eigenvector of the transposed problem matrix and that a matrix whose rows consist of left eigenvectors is the inverse of the matrix whose columns consist of right eigenvectors.

In MATLAB®:

If [Vr,Dr]=eig(A) produces the right eigenvectors of A then [Vl,Dl]=eig(A') produces right eigenvectors of the transposed matrix and thus the transposed left eigenvectors of the problem matrix. It also holds that Dr=Dl. It must be assured that MATLAB® orders left and right vectors in an identical order. One can test for diagonality now by computing Vr*Vl'=diagonal. Additional scaling of the eigenvectors might be necessary to achieve a unit-diagonal matrix.

Iterative Improvement

Assuming that as $\tilde{P}^{-1}$ computed by MATLAB® differs from the correct $P^{-1}$ according to $P*\tilde{P}^{-1}=P*(P^{-1}+dP^{-1})=1+dE$. Now observing that $P*dP^{-1}=dE$ one can solve for $dP^{-1}$ using Gaussian elimination (precise to machine precision and much faster) which means that $P^{-1}$ is never actually computed:

$$dP^{-1}=P_{gauss}^{-1}dE$$

Then it is set $\tilde{P}_{new}^{-1}=\tilde{P}^{-1}-dP^{-1}$ and the process is repeated until a given criterion is reached. A possible criterion could be $$1 - norm\left(P*\tilde{P}^{-1}_{n\text{-}th\ iteration}\right) \leq 10^{-12}$$

Figure 5:
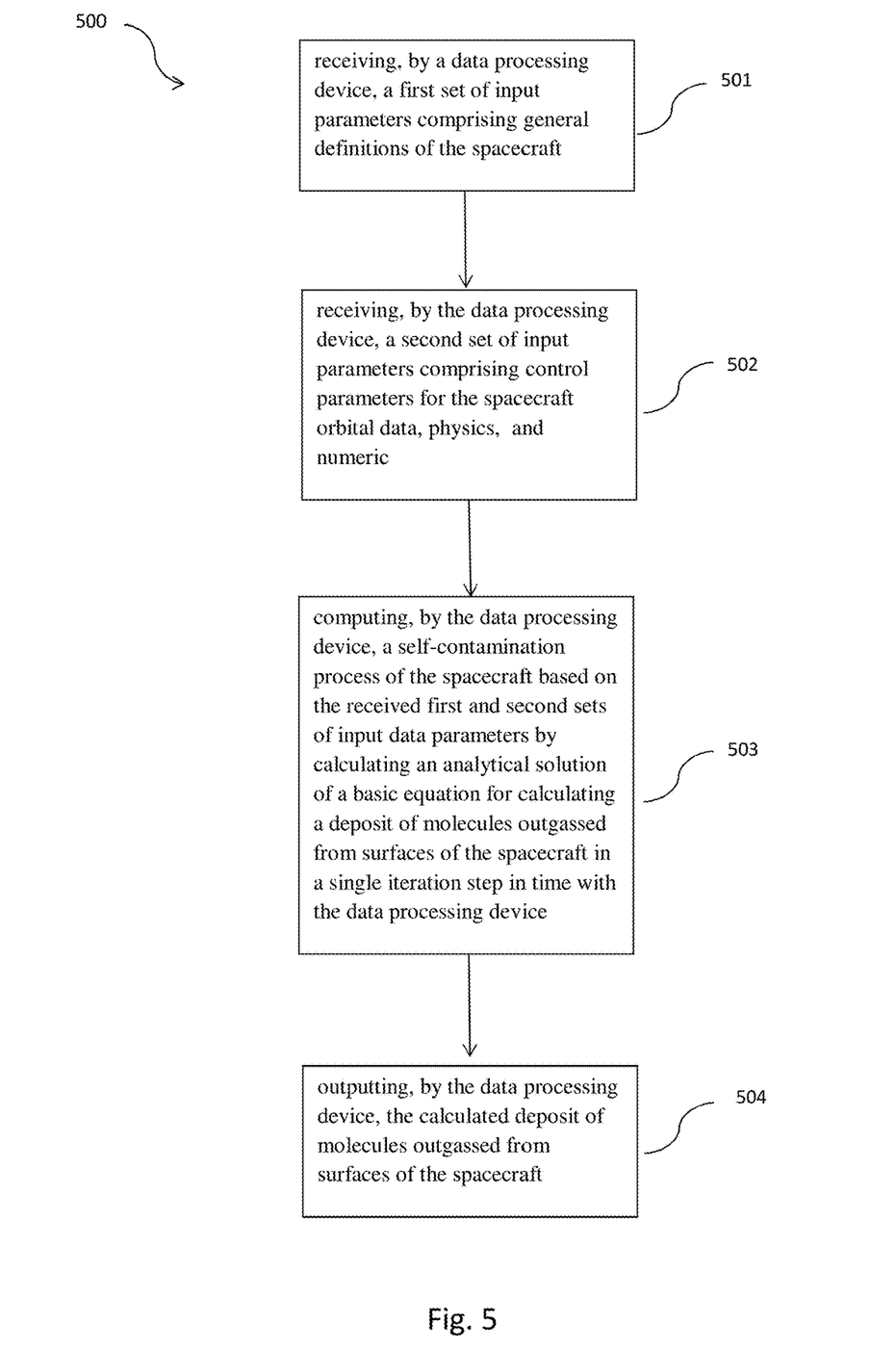
FIG. 5 shows a method for computing self-contamination processes of a spacecraft.
Figure 6:
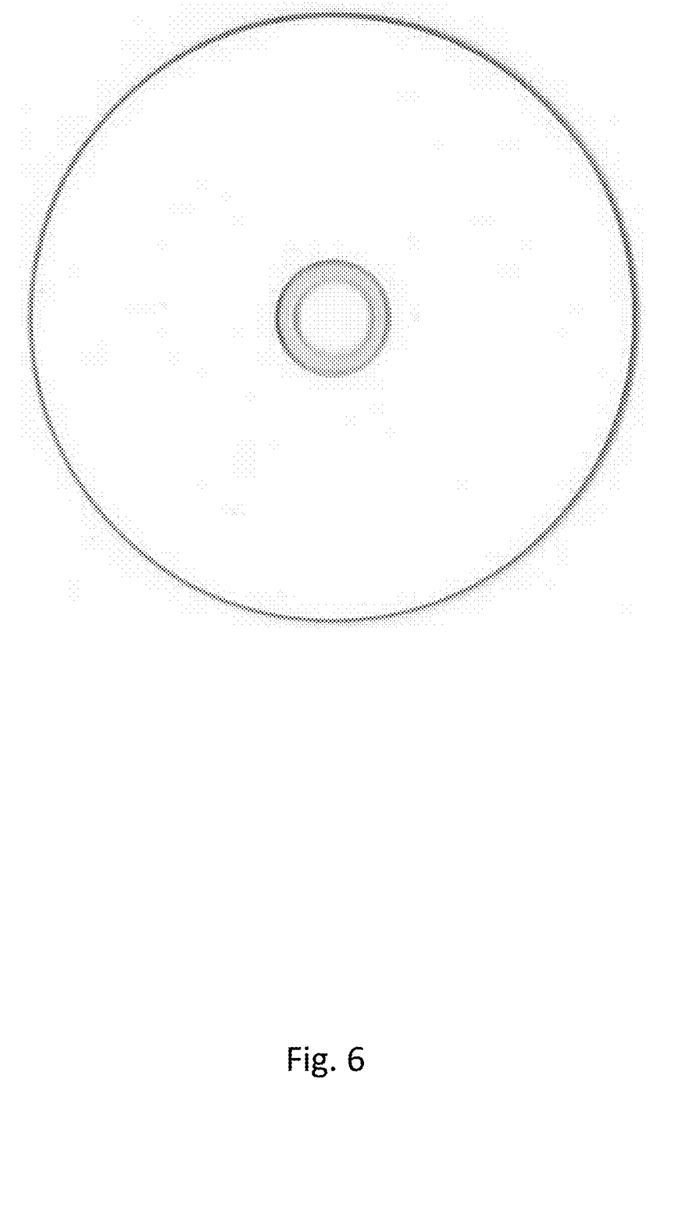
FIG. 6 shows one embodiment of a computer program product comprising a non-transitory computer readable medium suitable for storing a computer program thereon which, when executed by a computer, implements the method computing self-contamination processes of a spacecraft according to the invention.

FIG. 5 shows a process 500 for computing self-contamination processes of a spacecraft, comprising receiving, by a data processing device, a first set of input parameters comprising general definitions of the spacecraft (501); receiving, by the data processing device, a second set of input parameters comprising control parameters for the spacecraft orbital data, physics, and numeric (502); computing, by the data processing device, a self-contamination process of the spacecraft based on the received first and second sets of input data parameters by calculating an analytical solution of a basic equation for calculating a deposit of molecules outgassed from surfaces of the spacecraft in a single iteration step in time with the data processing device; (503) and outputting, by the data processing device, the calculated deposit of molecules outgassed from surfaces of the spacecraft (504).

The present invention enables the computation of self-contamination at a specific time directly in a single computation step without requiring iterative, time consuming and useless intermediate steps. Moreover, the computed solution is exact within the scope of computation accuracy. The method can be implemented as part of a software tool suite for spacecraft computations and simulations.

ACRONYMS

CNES Centre national d'études spatiales
COMOVA COntamination Modelling Outgassing & Vent Analyses tool
ESTEC European Space Research and Technology Centre
ODE Ordinary Differential Equation

What is claimed is:

1. A computer program product comprising a non-transitory computer readable medium having a plurality of instructions stored thereon, which when executed by a computer cause the computer to:
   receive a first set of input parameters comprising general definitions of the spacecraft;
   receive a second set of input parameters comprising control parameters for the spacecraft orbital data, physics, and numeric;
   compute a self-contamination process of the spacecraft based on the received first and second sets of input data parameters by calculating an analytical solution of a basic equation for calculating a deposit of molecules outgassed from surfaces of the spacecraft in a single iteration step in time with a data processing device;
   output the calculated deposit of molecules outgassed from surfaces of the spacecraft; and
   determine an adverse physical change on the spacecraft based on the calculated deposit of molecules outgassed from surfaces of the spacecraft,
   wherein computing the self-contamination process comprises computing view factors $F_{ji}$ of a mesh element j of a surface of the spacecraft with respect to a mesh element i of a surface of the spacecraft, wherein the spacecraft is represented as a collection of surfaces, which are subdivided into mesh elements with outgassing properties, which can vary from mesh element to mesh element, and
   wherein calculating the analytical solution of the basic equation comprises calculating the deposit for time dependent emission and reemission constants of the surfaces of the spacecraft with a basic equation of the form $$\dot{y}=Ay+tBy+b(t)$$

with y being the deposit at time t, A and B being constant matrices calculated from the time-dependent view factors $F_{ji}$ and the reemission coefficients and b being a vector consisting of the time-dependent emission coefficients, view factors and the initial deposit.

2. The computer program product of claim 1,
   wherein computing the self-contamination process comprises computing view factors $F_{ji}$ of a mesh element j of a surface of the spacecraft with respect to a mesh element i of a surface of the spacecraft, wherein the spacecraft is represented as a collection of surfaces, which are subdivided into mesh elements with outgassing properties, which can vary from mesh element to mesh element, and
   wherein calculating the analytical solution of the basic equation comprises calculating the deposit for piecewise constant emission and reemission constants of the surfaces of the spacecraft, with the abbreviated basic equation being $$\dot{y}=Ay+b$$

with y being the deposit at time t, A being a constant matrix calculated from the view factors $F_{ji}$ and the reemission coefficients and b being a vector consisting of the emission coefficients, view factors and the initial deposit.

3. A method for computing self-contamination processes of a spacecraft, comprising the following steps:
- receiving, by a data processing device, a first set of input parameters comprising general definitions of the spacecraft;
- receiving, by the data processing device, a second set of input parameters comprising control parameters for the spacecraft orbital data, physics, and numeric;
- computing, by the data processing device, a self-contamination process of the spacecraft based on the received first and second sets of input data parameters by calculating an analytical solution of a basic equation for calculating a deposit of molecules outgassed from surfaces of the spacecraft in a single iteration step in time with the data processing device;
- outputting, by the data processing device, the calculated deposit of molecules outgassed from surfaces of the spacecraft; and
- determining an adverse physical change on the spacecraft based on the calculated deposit of molecules outgassed from surfaces of the spacecraft, wherein computing the self-contamination process comprises computing view factors $F_{ji}$ of a mesh element j of a surface of the spacecraft with respect to a mesh element i of a surface of the spacecraft, wherein the spacecraft is represented as a collection of surfaces, which are subdivided into mesh elements with outgassing properties, which can vary from mesh element to mesh element, wherein calculating the analytical solution of the basic equation comprises calculating the deposit for time dependent emission and reemission constants of the surfaces of the spacecraft with a basic equation of the form $$\dot{y} = Ay + tBy + b(t)$$

with y being the deposit at time t, A and B being constant matrices calculated from the time-dependent view factors $F_{ji}$ and the reemission coefficients and b being a vector consisting of the time-dependent emission coefficients, view factors and the initial deposit.

* * * * *